(12) United States Patent
Chopra et al.

(10) Patent No.: US 11,965,241 B2
(45) Date of Patent: Apr. 23, 2024

(54) CLUSTER TOOLS, SYSTEMS, AND METHODS HAVING ONE OR MORE PRESSURE STABILIZATION CHAMBERS

(71) Applicant: Applied Materials, Inc., Santa Clara, CA (US)

(72) Inventors: Saurabh Chopra, Santa Clara, CA (US); Martin Jeffrey Salinas, San Jose, CA (US); Masato Ishii, Sunnyvale, CA (US); Sheng-Chen Twan, Hsinchu (TW); Srividya Natarajan, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/869,529

(22) Filed: Jul. 20, 2022

(65) Prior Publication Data
US 2023/0075715 A1 Mar. 9, 2023

Related U.S. Application Data

(60) Provisional application No. 63/240,727, filed on Sep. 3, 2021.

(51) Int. Cl.
*H01L 21/67* (2006.01)
*C23C 16/44* (2006.01)
*H01L 21/02* (2006.01)

(52) U.S. Cl.
CPC ...... *C23C 16/4405* (2013.01); *H01L 21/0262* (2013.01); *H01L 21/67207* (2013.01)

(58) Field of Classification Search
CPC ............ C23C 16/4405; H01L 21/0262; H01L 21/67207; H01L 21/68742; H01L 21/67115; H01L 21/67184
See application file for complete search history.

(56) References Cited

U.S. PATENT DOCUMENTS

| 9,870,921 | B2 | 1/2018 | Olsen et al. |
| 2002/0084032 | A1 | 7/2002 | Jeng et al. |
| 2007/0020890 | A1* | 1/2007 | Thakur ............. H01L 21/67207 118/719 |
| 2007/0181057 | A1* | 8/2007 | Lam ...................... C23C 16/505 257/E21.252 |

(Continued)

OTHER PUBLICATIONS

International Search Report and Written Opinion dated Nov. 18, 2022 for Application No. PCT/US2022/037676.

*Primary Examiner* — Erin F Bergner
(74) *Attorney, Agent, or Firm* — Patterson + Sheridan, LLP (57) ABSTRACT

In one aspect, a process operation is conducted at a first pressure in a process chamber, and an epitaxial deposition operation is conducted at an atmospheric pressure in an epitaxial deposition chamber. The atmospheric pressure is greater than the first pressure. The process chamber is mounted to a first mainframe that operates at the first pressure (a reduced pressure), and the epitaxial deposition chamber is mounted to a second mainframe that operates at the atmospheric chamber. In one aspect, the process chamber is a cleaning chamber (such as a pre-clean chamber) and the process operation is a cleaning operation. In one aspect, the process chamber is an atmospheric pressure epitaxial deposition chamber and the process operation is an atmospheric pressure epitaxial deposition operation.

19 Claims, 4 Drawing Sheets

(56) References Cited

U.S. PATENT DOCUMENTS

| | | | |
|---|---|---|---|
| 2009/0029528 A1* | 1/2009 | Sanchez | H01L 21/02255 |
| | | | 257/E21.191 |
| 2010/0304027 A1* | 12/2010 | Lee | C23C 16/54 |
| | | | 427/255.39 |
| 2015/0040822 A1 | 2/2015 | Olsen et al. | |
| 2015/0044800 A1* | 2/2015 | Lim | H10K 71/00 |
| | | | 438/34 |
| 2017/0018443 A1* | 1/2017 | Lin | H01L 21/67201 |
| 2018/0076065 A1* | 3/2018 | Bao | H01L 21/2855 |
| 2020/0152493 A1 | 5/2020 | Colombeau et al. | |
| 2021/0257252 A1 | 8/2021 | Clemons et al. | |

* cited by examiner

CLUSTER TOOLS, SYSTEMS, AND METHODS HAVING ONE OR MORE PRESSURE STABILIZATION CHAMBERS

CROSS-REFERENCE TO RELATED APPLICATIONS

This application claims benefit of U.S. Provisional Application No. 63/240,727, filed Sep. 3, 2021, which is herein incorporated by reference in its entirety.

BACKGROUND

Field

Embodiments of the present disclosure generally relate to cluster tools, systems and methods including one or more pressure stabilization chambers.

Description of the Related Art

During the processing of substrates, growth rates of epitaxial operations can be limited. Efforts to increase growth rates can result in increased contaminants on substrates, or can otherwise hinder the performance of the device formed by the processed substrate.

Therefore, there is a need for improved apparatus, systems, and methods that facilitate increased epitaxial growth rates.

SUMMARY

Embodiments of the present disclosure generally relate to cluster tools, systems and methods having one or more pressure stabilization chambers. In one aspect of the disclosure, a cleaning operation is conducted at a first pressure in a cleaning chamber, and an epitaxial deposition operation is conducted at an atmospheric pressure and a temperature in an epitaxial deposition chamber. The atmospheric pressure is greater than the first pressure.

In one implementation, a cluster tool suitable for processing semiconductor substrates includes a first mainframe, one or more process chambers mounted to the first mainframe, and a second mainframe coupled to the first mainframe. The one or more process chambers are configured to conduct a process operation at a first pressure that is less than 700 Torr. The cluster tool includes one or more epitaxial deposition chambers coupled to the second mainframe. The one or more epitaxial deposition chambers are configured to conduct an epitaxial deposition operation at an atmospheric pressure within a range of 700 Torr to 800 Torr.

In one implementation, a method of processing a substrate includes positioning the substrate in a factory interface, and transferring the substrate from the factory interface to a first processing volume of a cleaning chamber. The method includes conducting a cleaning operation on the substrate in the cleaning chamber while maintaining the first processing volume at a first pressure to remove a native oxide from the substrate. The first pressure is less than 700 Torr. The method includes maintaining a pressure of a pressure stabilization chamber at the first pressure, and transferring the substrate from the cleaning chamber to the pressure stabilization chamber through a first door of the pressure stabilization chamber. The method includes closing the first door, and increasing the pressure of the pressure stabilization chamber to an atmospheric pressure within a range of 700 Torr to 800 Torr. The method includes opening a second door of the pressure stabilization chamber, and transferring the substrate from the pressure stabilization chamber to a second processing volume of an epitaxial deposition chamber. The method includes conducting an epitaxial deposition operation on the substrate while maintaining the second processing volume at the atmospheric pressure.

In one implementation, a method of processing a substrate includes positioning the substrate in a factory interface, and transferring the substrate from the factory interface to a first processing volume of a first epitaxial deposition chamber. The method includes conducting a first epitaxial deposition operation on the substrate in the first epitaxial deposition chamber while maintaining the first processing volume at a first pressure. The first pressure is less than 700 Torr. The method includes maintaining a pressure of a pressure stabilization chamber at the first pressure, and transferring the substrate from the first epitaxial deposition chamber to the pressure stabilization chamber through a first door of the pressure stabilization chamber. The method includes closing the first door, and increasing the pressure of the pressure stabilization chamber to an atmospheric pressure within a range of 700 Torr to 800 Torr. The method includes opening a second door of the pressure stabilization chamber, and transferring the substrate from the pressure stabilization chamber and to a second processing volume of a second epitaxial deposition chamber. The method includes conducting a second epitaxial deposition operation on the substrate while maintaining the second processing volume at the atmospheric pressure.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to cluster tools, systems and methods including one or more pressure stabilization chambers. In one aspect of the disclosure, a cleaning operation is conducted at a first pressure in a cleaning chamber, and an epitaxial deposition operation is conducted at an atmospheric pressure and a temperature in an epitaxial deposition chamber. The atmospheric pressure is greater than the first pressure, and the temperature is within a range of 400 degrees Celsius to 1,200 degrees Celsius.

The disclosure contemplates that terms such as "couples," "coupling," "couple," and "coupled" may include but are not limited to welding, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling. The disclosure contemplates that terms such as "couples," "coupling," "couple," and "coupled" may include operable coupling such as electric coupling and/or fluidly coupling.

Figure 1:
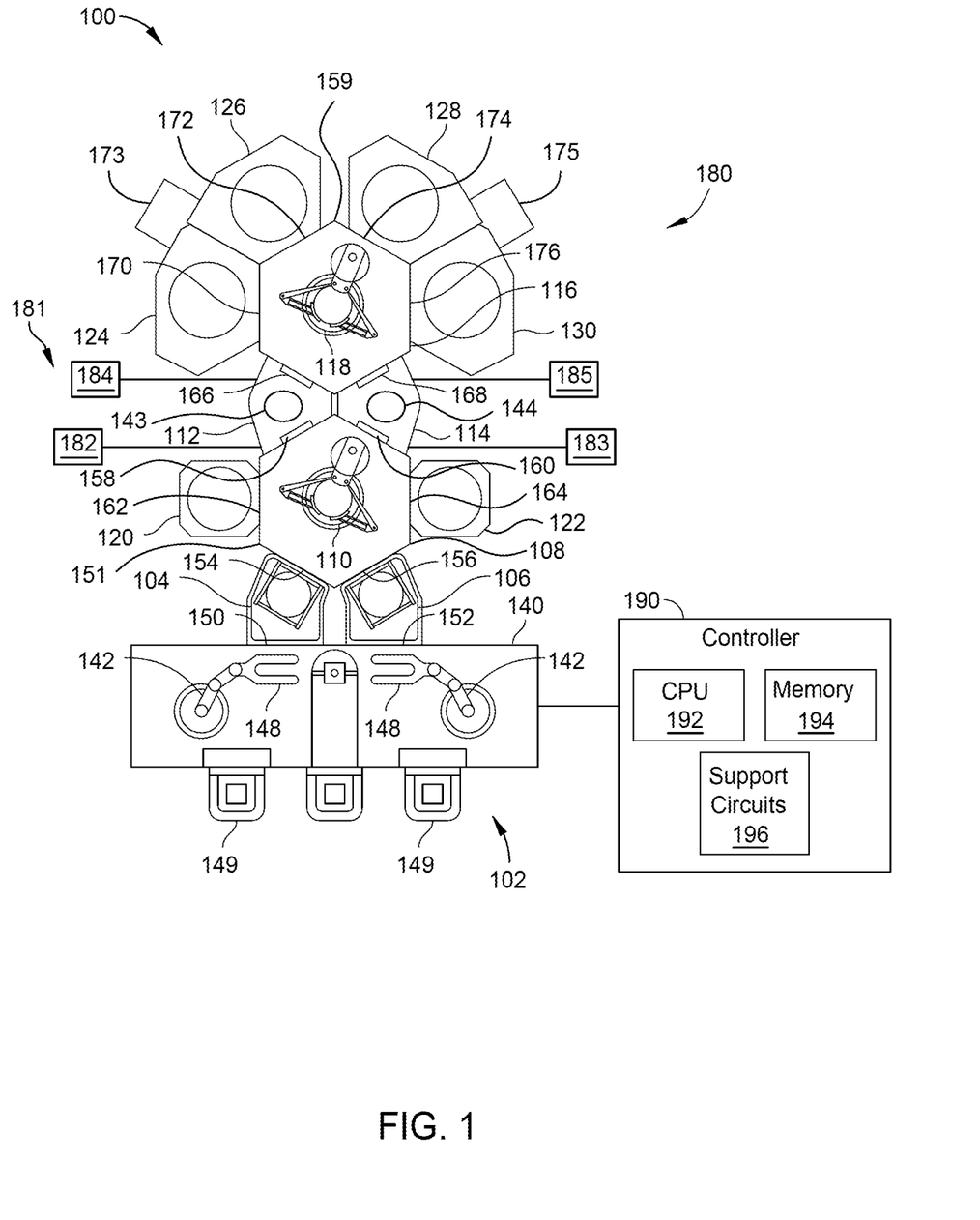
FIG. 1 is a schematic top-view diagram of a system for processing substrates, according to one implementation.

FIG. 1 is a schematic top-view diagram of a system 100 for processing substrates, according to one implementation. The system 100 includes a cluster tool 180. The cluster tool 180 includes a factory interface 102, one or more load lock chambers 104, 106 (two are shown), and one or more transfer chambers 108, 116 (two are shown) with respective transfer robots 110, 118 disposed therein. The cluster tool 180 includes one or more first chambers 120, 122 (two are shown) mounted to a first mainframe 151 and one or more epitaxial deposition chambers 124, 126, 128, 130 (four are shown) mounted to a second mainframe 159. The second mainframe 159 is coupled to the first mainframe 151. The system 100 includes one or more gas boxes 173, 175 (two are shown) fluidly connected to the one or more epitaxial deposition chambers 124, 126, 128, 130. The one or more gas boxes 173, 175 are configured to supply one or more process gases and/or one or more purge gases to the one or more epitaxial deposition chambers 124, 126, 128, 130.

The cluster tool 180 includes one or more pressure stabilization chambers 112, 114 (two are shown) coupled between the one or more first chambers 120, 122 and the one or more epitaxial deposition chambers 124, 126, 128, 130. In the implementation shown in FIG. 1, each pressure stabilization chamber 112, 114 is coupled between the transfer chambers 108 and 116. The pressure stabilization chambers 112 and 114 can be viewed as load locks through which substrates are transferred between the first mainframe 151, which is maintained at a reduced pressure below an atmospheric pressure, and the second mainframe 159, which is maintained at the atmospheric pressure. As detailed herein, substrates in the system 100 can be processed in, and transferred between, the various chambers without being exposed to an ambient environment exterior to the cluster tool 180. For example, substrates can be processed in, and transferred between, the various chambers in a low pressure (e.g., 700 Torr or less, such as 300 Torr or less) or vacuum environment without breaking the low pressure or vacuum environment between various processes performed on the substrates in the system 100. The system 100 may provide for an integrated cluster tool 180 for conducting processing operations on substrates.

In the implementation shown in FIG. 1, the factory interface 102 includes a docking station 140 and factory interface robots 142 to facilitate transfer of substrates. The docking station 140 is configured to accept one or more front opening unified pods (FOUPs) 149. In some embodiments, which can be combined with other embodiments, each factory interface robot 142 includes a blade 148 disposed on one end of the respective factory interface robot 142 configured to transfer substrates from the factory interface 102 to the load lock chambers 104, 106.

The load lock chambers 104, 106 include respective doors 150, 152 interfacing with the factory interface 102 and respective doors 154, 156 interfacing with the first transfer chamber 108. The pressure stabilization chambers 112, 114 each include a respective first door 158, 160 interfacing with a first transfer chamber 108 and a respective second door 166, 168 interfacing with a second transfer chamber 116.

The first transfer chamber 108 includes respective doors 162, 164 interfacing with the first chambers 120, 122. The second transfer chamber 116 includes respective doors 170, 172, 174, 176 interfacing with the epitaxial deposition chambers 124, 126, 128, 130. The doors 154, 156, 158, 160, 162, 164, 166, 168, 170, 172, 174, 176 can include, for example, slit openings with slit valves for passing substrates therethrough by the transfer robots 110, 118. Each door 154, 156, 158, 160, 162, 164, 166, 168, 170, 172, 174, 176 can be configured to provide a seal between respective chambers to prevent a gas from passing between the respective chambers. Each door 154, 156, 158, 160, 162, 164, 166, 168, 170, 172, 174, 176 can be opened for transferring a substrate between chambers, and otherwise can be closed, such as during a processing operation.

The load lock chambers 104, 106, the transfer chambers 108, 116, the pressure stabilization chambers 112, 114, the first chambers 120, 122, and the epitaxial deposition chambers 124, 126, 128, 130 may be fluidly coupled to a gas and pressure control system 181. The gas and pressure control system 181 can include one or more gas pumps (e.g., turbo pumps, cryo-pumps, roughing pumps, vacuum pumps, etc.), gas sources, various valves, and conduits fluidly coupled to the various chambers. For example, each load lock chamber 104, 106 may be coupled to a gas source and/or an exhaust pump of the gas and pressure control system 181.

As illustrated in FIG. 1, in some embodiments, the gas and pressure control system 181 includes a first gas source 182 fluidly connected to an internal volume of the first pressure stabilization chamber 112 and a second gas source 183 fluidly connected to an internal volume of the second pressure stabilization chamber 114. The gas and pressure control system 181 includes a first exhaust pump 184 fluidly connected to the internal volume of the first pressure stabilization chamber 112 and the second exhaust pump 185 fluidly connected to the internal volume of the second pressure stabilization chamber 114. The gas sources 182, 183 supply a pressure stabilization gas to the pressure stabilization chambers 112, 114, and the exhaust pumps 184, 185 exhaust the pressure stabilization gas from the pressure stabilization chambers 112, 114. The pressure stabilization gas is an inert gas. In some embodiments, which can be combined with other embodiments, the pressure stabilization gas is nitrogen ($N_2$). An internal pressure of the pressure stabilization chambers 112, 114 can be increased by increasing a supply of the pressure stabilization gas from the gas sources 182, 183 and/or by reducing an exhaust rate using the exhaust pumps 184, 185. The internal pressure of the pressure stabilization chambers 112, 114 can be reduced by reducing a supply of the pressure stabilization gas from the gas sources 182, 183 and/or by increasing an exhaust rate using the exhaust pumps 184, 185.

The present disclosure contemplates that the pressure stabilization gas can be supplied to and exhausted from the first transfer chamber 108 and the second transfer chamber 116 for transferring of substrates between chambers. The present disclosure contemplates that the pressure stabilization gas can be supplied to and exhausted from the first chambers 120, 122 and/or the epitaxial deposition chambers 124, 126, 128, 130 for transferring of substrates between chambers.

In operation, a factory interface robot 142 transfers a substrate from a FOUP 149 through a door 150 or 152 to a load lock chamber 104 or 106. The gas and pressure control system 181 then pumps down the load lock chamber 104 or 106. In an example, the gas and pressure control system 181 reduces a pressure within the load lock chamber 104 or 106. The gas and pressure control system 181 maintains the transfer chamber 108 at a first pressure. In some embodiments, the first pressure is less than a pressure of the atmospheric environment of the factory interface 102. In some embodiments, the gas and pressure control system 181 maintains the pressure stabilization chambers 112, 114 at the first pressure. The pumping down of the load lock chamber 104 or 106 facilitates passing the substrate between e.g., the atmospheric environment of the factory interface 102 and the first pressure of the first transfer chamber 108.

With the substrate in the load lock chamber 104 or 106 that has been pumped down, the transfer robot 110 transfers the substrate from the load lock chamber 104 or 106 into the first transfer chamber 108 through the door 154 or 156. The transfer robot 110 is then capable of transferring the substrate to and/or between any of the first chambers 120, 122 through the respective doors 162, 164 for processing and the pressure stabilization chambers 112, 114 through the respective doors 158, 160 for holding to await further transfer. Using the transfer robot 110, the substrate is transferred to a respective substrate support 143 or 144 (such as a pedestal) disposed in the respective pressure stabilization chamber 112 or 114 while the respective first door 158 or 160 is open. The substrate is supported on the substrate support 143 or 144 and the transfer robot 110 is retracted into the first transfer chamber 108. The respective first door 158 or 160 is closed.

The transfer robot 118 is capable of accessing the substrate from the substrate support 143 or 144 in the pressure stabilization chamber 112 or 114 through the second door 166 or 168 and is capable of transferring the substrate to and/or between any of the epitaxial deposition chambers 124, 126, 128, 130 through the respective doors 170, 172, 174, 176 for epitaxial deposition. The transfer robot 118 is also capable of transferring the substrate to and/or between the pressure stabilization chambers 112, 114 through the respective doors 166, 168 for holding to await further transfer.

The first chambers 120, 122 are configured to conduct a processing operation on substrates disposed therein, and the epitaxial deposition chambers 124, 126, 128, 130 are configured to conduct an epitaxial deposition operation on substrates disposed therein. The processing operation of the first chambers 120, 122 is conducted at the first pressure, and the epitaxial deposition operation of the epitaxial deposition chambers 124, 126, 128, 130 is conducted at atmospheric pressure. In some embodiments, which can be combined with other embodiments, the processing operation is a cleaning operation configured to remove native oxide from the substrates. In some embodiments, which can be combined with other embodiments, the processing operation of the first chambers 120, 122 is a first epitaxial deposition operation to deposit a first epitaxial layer on the substrates, and the epitaxial deposition operation of the epitaxial deposition chambers 124, 126, 128, 130 is a second epitaxial layer to deposit a second epitaxial layer on the substrates. In some embodiments, which can be combined with other embodiments, the epitaxial deposition operation of the epitaxial deposition chambers 124, 126, 128, 130 is conducted on substrate(s) following conducting of the processing operation of the first chambers 120, 122 on the substrate(s). In some embodiments, which can be combined with other embodiments, the processing operation of the first chambers 120, 122 is conducted on substrate(s) following the conducting of the epitaxial deposition operation of the epitaxial deposition chambers 124, 126, 128, 130 on the substrate(s).

As a substrate is transferred from a first chamber 120 or 122 to a pressure stabilization chamber 112 or 114 through the first transfer chamber 108, an internal pressure of the pressure stabilization chamber 112 or 114 and the first transfer chamber 108 is maintained at the first pressure using the gas and pressure control system 181. The first door 158 or 160 is closed, and the internal pressure of the pressure stabilization chamber 112 or 114 is increased (using the gas and pressure control system 181) to the atmospheric pressure. The second transfer chamber 116 is also maintained at the atmospheric pressure using the gas and pressure control system 181. The second door 166, 168 is opened, and the substrate is transferred from the pressure stabilization chamber 112 or 114 and to one of the epitaxial deposition chambers 124, 126, 128, 130 through the second transfer chamber 116 while maintaining the pressure stabilization chamber 112 or 114 at the atmospheric pressure. The operational changes of the internal pressure of the pressure stabilization chamber 112 or 114 can be reversed if the substrate is transferred from an epitaxial deposition chamber 124, 126, 128, or 130 and to a first chamber 120 or 122.

The present disclosure contemplates that the chambers 120, 122, 124, 126, 128, 130 can be other chambers for processing substrates, such as etch chambers. The present disclosure contemplates that operations in any of the chambers 120, 122, 124, 126, 128, 130 may be performed at a pressure lower than or equal to the first pressure. The present disclosure contemplates that operations in any of the chambers 120, 122, 124, 126, 128, 130 may be performed at a pressure between the first pressure and atmospheric pressure. The present disclosure contemplates that operations in any of the chambers 120, 122, 124, 126, 128, 130 may be performed at a pressure greater than or equal to atmospheric pressure.

The system 100 includes a controller 190 configured to control the system 100 or components thereof. For example, the controller 190 may control the operation of the system 100 using a direct control of the chambers 104, 106, 108, 112, 114, 116, 120, 122, 124, 126, 128, 130 of the system 100 or by controlling controllers associated with the chambers 104, 106, 108, 112, 114, 116, 120, 122, 124, 126, 128, 130. The controller 190 is configured to control the gas and pressure control system 181. In operation, the controller 190 enables data collection and feedback from the respective chambers and the gas and pressure control system 181 to coordinate and control performance of the system 100.

The controller 190 generally includes a central processing unit (CPU) 192, a memory 194, and support circuits 196. The CPU 192 may be one of any form of a general purpose processor that can be used in an industrial setting. The memory 194, or non-transitory computer-readable medium, is accessible by the CPU 192 and may be one or more of memory such as random access memory (RAM), read only memory (ROM), floppy disk, hard disk, or any other form of digital storage, local or remote. The support circuits 196 are coupled to the CPU 192 and may comprise cache, clock circuits, input/output subsystems, power supplies, and the like.

The various methods (such as the method 400) and operations disclosed herein may generally be implemented under the control of the CPU 192 by the CPU 192 executing computer instruction code stored in the memory 194 (or in memory of a particular processing chamber) as, e.g., a software routine. When the computer instruction code is executed by the CPU 192, the CPU 192 controls the chambers to conducted processes in accordance with the various methods and operations described herein. In some embodiments, which can be combined with other embodiments, the memory 194 includes instructions stored therein that, when executed, cause the methods (such as the method 400) and operations described herein to be conducted.

Other processing systems in other configurations are contemplated. For example, more or fewer processing chambers may be coupled to a transfer apparatus. In the implementation shown in FIG. 1, the transfer apparatus includes the transfer chambers 108, 116 and the pressure stabilization chambers 112, 114. In other implementations, more or fewer transfer chambers (e.g., one transfer chamber) and/or more or fewer pressure stabilization chambers (e.g., no pressure stabilization chambers) may be implemented as a transfer apparatus in a system for processing substrates.

Figure 2:
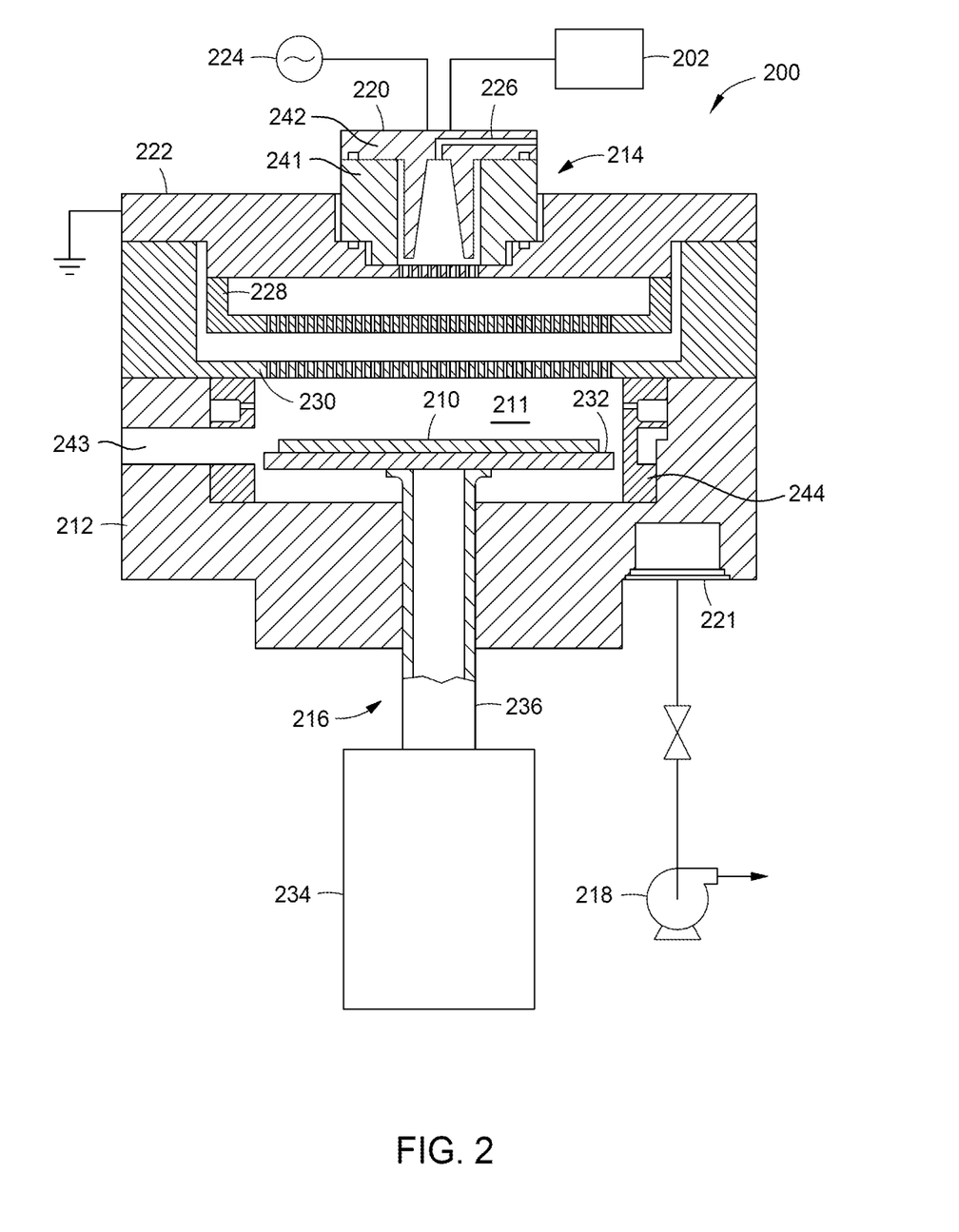
FIG. 2 is a schematic cross-sectional view of a processing chamber, according to one implementation.

FIG. 2 is a schematic cross-sectional view of a processing chamber 200, according to one implementation. The processing chamber 200 is a cleaning chamber, such as a pre-clean chamber. The processing chamber 200 may be used as any of the first chambers 120, 122 shown in FIG. 1. The processing chamber 200 can be configured to conduct a thermal or plasma-based oxidation process and/or a plasma assisted dry etch process. The processing chamber 200 includes a chamber body 212, a lid assembly 214, and a support assembly 216. The lid assembly 214 is disposed at an upper end of the chamber body 212, and the support assembly 216 is at least partially disposed within the chamber body 212. A vacuum system can be used to remove gases from processing chamber 200. The vacuum system includes a vacuum pump 218 coupled to a vacuum port 221 disposed in the chamber body 212. The vacuum system can be part of the gas and pressure control system 181 shown in FIG. 1.

The lid assembly 214 includes at least two stacked components 222, 241, 242 (three are shown) configured to form a plasma volume or cavity therebetween. A first electrode 220 is disposed vertically above a second electrode 222 confining a plasma volume. The first electrode 220 is connected to a power source 224, such as a radio frequency (RF) power supply, and the second electrode 222 is connected to ground or a source return, forming a capacitance between the first electrode 220 and the second electrode 222. The lid assembly 214 includes one or more gas inlets 226 for providing a cleaning gas to a substrate surface through blocker plate 228 and gas distribution plate 230. The cleaning gas may be an etchant or ionized active radical, such as ionized fluorine, chlorine, or ammonia, or an oxidizing agent, such as ozone. Additionally, the processing chamber 200 includes a controller 202 for controlling processes within the processing chamber 200. The controller 202 can be part of (e.g., integrated with) or in communication with the controller 190 shown in FIG. 1.

The support assembly 216 may include a substrate support 232 to support a substrate 210 thereon during processing. The substrate support 232 may be coupled to an actuator 234 by a shaft 236, which extends through a centrally-located opening formed in a bottom surface of the chamber body 212. The actuator 234 may be flexibly sealed to the chamber body 212 by bellows (not shown) that prevent vacuum leakage from around the shaft 236. The actuator 234 allows the substrate support 232 to be moved vertically within the chamber body 212 between a process position and a lower, transfer position. The transfer position is slightly below an opening 243 of a slit valve formed in a sidewall of the chamber body 212. A pumping ring 244 (which can include one or more pumping liners) is disposed in a first processing volume 211 of the processing chamber 200 to facilitate exhausting gases from the first processing volume 211.

The substrate support 232 has a flat, or a substantially flat, surface for supporting a substrate 210 to be processed thereon. The substrate support 232 may be moved vertically within the chamber body 212 by actuator 234 coupled thereto by shaft 236. In operation, the substrate support 232 may be elevated to a position in close proximity to the lid assembly 214 to control the temperature of the substrate 210 being processed. As such, the substrate 210 may be heated via radiation emitted or convection from the gas distribution plate 230.

The processing chamber 200 is configured to conduct a cleaning operation on the substrate 210 to remove a native oxide from the substrate 210. The native oxide can include $SiO_2$. The cleaning operation is conducted while maintaining the first processing volume 211 of the processing chamber 200 at the first pressure and a first temperature. The first temperature is 1,000 degrees Celsius or less, such as 800 degrees Celsius or less. In some embodiments, which can be combined with other embodiments, the first temperature is within a range of 15 degrees Celsius to 130 degrees Celsius, such as 20 degrees Celsius to 100 degrees Celsius. In some embodiments, which can be combined with other embodiments, the first temperature is within a range of 0 degrees Celsius to 50 degrees Celsius, such as 20 degrees Celsius to 40 degrees Celsius. The first pressure is less than 700 Torr, such as 600 Torr or less. In some embodiments, which can be combined with other embodiments, the first pressure is within a range of 5 Torr to 600 Torr, such as 100 Torr to 500 Torr, such as 200 Torr to 400 Torr. In some embodiments, which can be combined with other embodiments, the first pressure is within a range of 30 Torr to 80 Torr. In some embodiments, which can be combined with other embodiments, the first pressure is 5 Torr. In some embodiments, which can be combined with other embodiments, the first pressure is 300 Torr. In some embodiments, which can be combined with other embodiments, the first pressure is 600 Torr.

The present disclosure contemplates that the first pressure described is used for the first epitaxial deposition operation if the first chambers 120, 122 are epitaxial deposition chambers.

During the cleaning operation, the substrate 210 can be exposed to a plasma that is generated. The plasma includes one or more of $NH_3$, and/or $NF_3$. The plasma can also include one or more inert gases such as one or more of helium (He), nitrogen ($N_2$), and/or argon (Ar). The plasma can be a capacitively coupled plasma or an inductively coupled plasma. The plasma can be supplied from a remote plasma source, and the plasma can be introduced into a processing chamber through a gas distribution plate, such as a showerhead. $NH_3$ is directly injected into the chamber via a separate gas inlet. The cleaning operation can include exposing the substrate 210 to a thermal combination of anhydrous HF and $NH_3$, exposing the substrate 210 to aqueous HF, a dry etch operation (such as a remote plasma assisted dry etch operation), and/or a silicon-etching operation (e.g., ICP H$_2$/Cl$_2$ silicon etching). The dry etch operation can include exposure of the substrate 210 to NF$_3$ and NH$_3$ plasma by-products.

The cleaning operation can include a wet clean operation. The substrate 210 may be cleaned using a wet cleaning operation in which the substrate 210 is exposed to a cleaning solution, such as a HF-last type cleaning solution, ozonated water cleaning solution, hydrofluoric acid (HF) and hydrogen peroxide (H$_2$O$_2$) solution, and/or other suitable cleaning solution. The cleaning solution may be heated.

Figure 3:
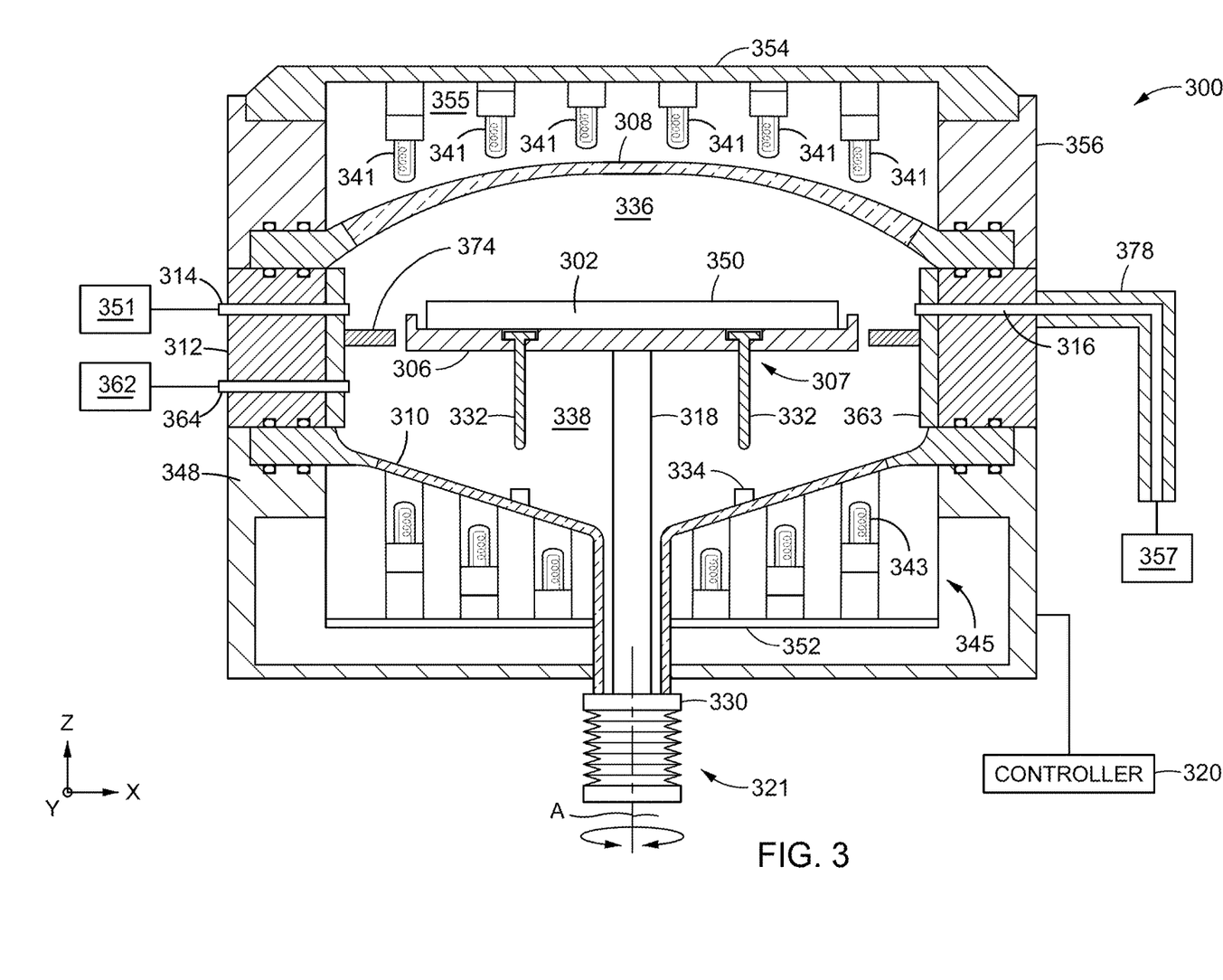
FIG. 3 is a schematic cross-sectional view of a deposition chamber, according to one implementation.

FIG. 3 is a schematic cross-sectional view of a deposition chamber 300, according to one implementation. The deposition chamber 300 is an epitaxial deposition chamber. The deposition chamber 300 can be used as the epitaxial deposition chambers 124, 126, 128, and/or 130 shown in FIG. 1, using the atmospheric pressure. The deposition chamber 300 can be used as the first chambers 120 and/or 122 shown in FIG. 1, using the first pressure. The deposition chamber 300 is utilized to grow an epitaxial film on a substrate, such as a substrate 302. The deposition chamber 300 creates a cross-flow of precursors across a top surface 350 of the substrate 302.

The deposition chamber 300 includes an upper body 356, a lower body 348 disposed below the upper body 356, and a flow module 312 disposed between the upper body 356 and the lower body 348. The upper body 356, the flow module 312, and the lower body 348 form a chamber body. Disposed within the chamber body is a substrate support 306, an upper window 308, a lower window 310, a plurality of upper lamps 341, and a plurality of lower lamps 343. As shown, a controller 320 is in communication with the deposition chamber 300 and is used to control operations and methods, such as those described herein. The controller 320 can be part of (e.g., integrated with) or in communication with the controller 190 shown in FIG. 1. The upper window 308 can be convex as shown in FIG. 3 (such as when the deposition chamber 300 is used with the first pressure), or the upper window 308 can be flat or concave (such as when the deposition chamber 300 is used with the atmospheric pressure).

The substrate support 306 is disposed between the upper window 308 and the lower window 310. The plurality of upper lamps 341 are disposed between the upper window 308 and a lid 354. The plurality of upper lamps 341 form a portion of the upper lamp module 355. The lid 354 can include a plurality of sensors (not shown) disposed therein for measuring a temperature within the deposition chamber 300. The plurality of lower lamps 343 are disposed between the lower window 310 and a floor 352. The plurality of lower lamps 343 form a portion of a lower lamp module 345. In the illustrated embodiment, the upper window 308 is an upper dome. In some embodiments, the upper window 308 is formed of an energy transmissive material, such as quartz. In the illustrated embodiment, the lower window 310 is a lower dome. In some embodiments, the lower window 310 is formed of an energy transmissive material, such as quartz.

A second processing volume 336 is formed between the upper window 308 and the lower window 310. The substrate support 306 is disposed in the second processing volume 336. The substrate support 306 includes a top surface on which the substrate 302 is disposed and supported. The substrate support 306 is attached to a shaft 318. The shaft is connected to a motion assembly 321. The motion assembly 321 includes one or more actuators and/or adjustment devices that provide movement and/or adjustment of the shaft 318 and/or the substrate support 306 within the second processing volume 336.

The substrate support 306 may include lift pin holes 307 disposed therein. The lift pin holes 307 are sized to accommodate a lift pin 332 for lifting of the substrate 302 from the substrate support 306 either before or after an epitaxial deposition operation is conducted using the deposition chamber 300. The lift pins 332 may rest on lift pin stops 334 when the substrate support 306 is lowered from a process position to a transfer position.

The flow module 312 includes a plurality of process gas inlets 314, a plurality of purge gas inlets 364, and one or more exhaust gas outlets 316. The plurality of process gas inlets 314 and the plurality of purge gas inlets 364 are disposed on the opposite side of the flow module 312 from the one or more exhaust gas outlets 316. One or more flow guides can be disposed below the plurality of process gas inlets 314 and the one or more exhaust gas outlets 316. The flow guides can be disposed above the purge gas inlets 364. A liner 363 is disposed on the inner surface of the flow module 312 and protects the flow module 312 from reactive gases used during epitaxial deposition operations. The process gas inlets 314 and the purge gas inlets 364 are positioned to flow a gas parallel to the top surface 350 of the substrate 302 disposed within the second processing volume 336. The process gas inlets 314 are fluidly connected to a process gas source 351. The purge gas inlets 364 are fluidly connected to a purge gas source 362.

The one or more exhaust gas outlets 316 are fluidly connected to an exhaust pump 357. The one or more exhaust gas outlets 316 are further connected to, or include, an exhaust system 378. The exhaust system 378 fluidly connects the one or more exhaust gas outlets 316 and the exhaust pump 357. The exhaust system 378 as described herein can include one or more growth monitors and can be configured to assist in the controlled epitaxial deposition of a layer on the substrate 302. In some embodiments, the process gas source 351, the purge gas source 362, the exhaust pump 357, and the exhaust system 378 are part of the gas and pressure control system 181 shown in FIG. 1.

The deposition chamber 300 includes a pre-heat ring 374 disposed in the second processing volume 336. During the epitaxial deposition operation, one or more process gases are supplied using the process gas source 351. The one or more process gases flow over the pre-heat ring 374 and over the top surface 350 of the substrate 302 while the second processing volume 336 and the substrate 302 are heated using the lamps 341, 343 to epitaxially deposit (e.g., grow) one or more film layers on the substrate 302. The epitaxially deposited film layers can include one or more of silicon (Si), silicon-germanium (SiGe), silicon phosphide (SiP), silicon arsenide (SiAs), and/or boron doped silicon-germanium (SiGeB).

The one or more process gases can include one or more of dichlorosilane, silane, disilane, germane, and/or hydrogen chloride. In some embodiments, which can be combined with other embodiments, the epitaxial deposition operation conducted using the deposition chamber 300 includes exposing the substrate 302 to a hydrogen-containing gas at a second temperature and the atmospheric pressure.

The epitaxial deposition operation is conducted while maintaining the second processing volume 336 at the second temperature. The second temperature is within a range of 400 degrees Celsius to 1,200 degrees Celsius. In some embodiments, which can be combined with other embodiments, the second temperature is within a range of 400 degrees Celsius to 800 degrees Celsius. In some embodiments, which can be combined with other embodiments, the second temperature is less than 400 degrees Celsius. In an implementation where the atmospheric pressure is used, the epitaxial deposition operation is conducted while maintaining the second processing volume 336 at the atmospheric pressure. In some embodiments, which can be combined with other embodiments, the atmospheric pressure is within a range of 700 Torr to 800 Torr, such as 720 Torr to 790 Torr, such as 740 Torr to 780 Torr, such as 750 Torr to 770 Torr. In some embodiments, which can be combined with other embodiments, the atmospheric pressure is 760 Torr.

Figure 4:
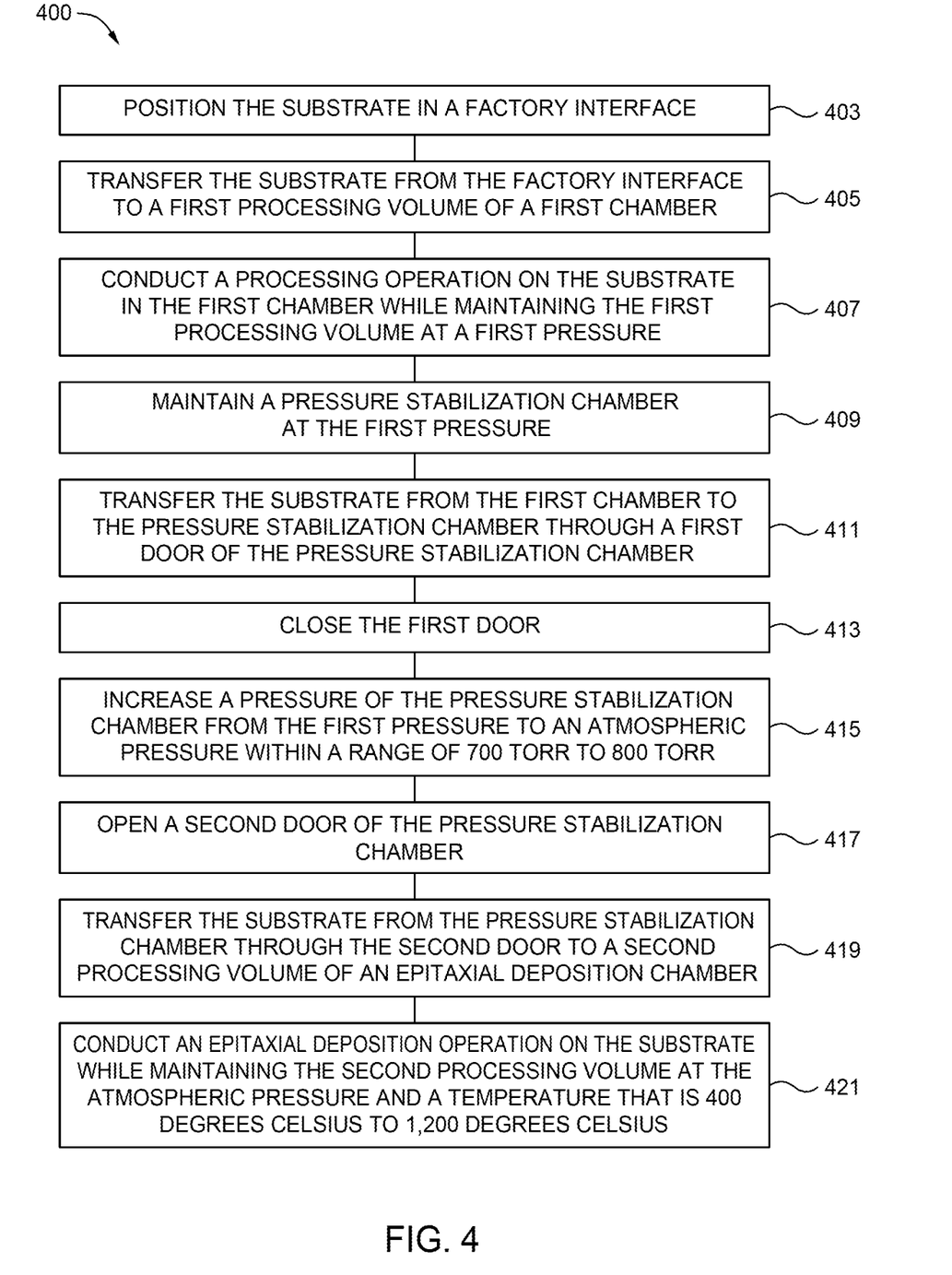
FIG. 4 is a schematic flow diagram view of a method of processing a substrate, according to one implementation.

FIG. 4 is a schematic flow diagram view of a method 400 of processing a substrate, according to one implementation. Operation 403 includes positioning the substrate in a factory interface, such as factory interface 102.

Operation 405 includes transferring the substrate from the factory interface to a first processing volume of a first chamber, such as first chamber 120 or 122. In some embodiments, which can be combined with other embodiments, the first chamber is a cleaning chamber, such as processing chamber 200. In some embodiments, which can be combined with other embodiments, the first chamber is a first epitaxial deposition chamber, such as deposition chamber 300.

Operation 407 includes conducting a processing operation on the substrate in the first chamber while maintaining the first processing volume at a first pressure. In some embodiments, the first pressure is less than atmospheric pressure, such as less than 760 Torr, such as less than 750 Torr, such as less than 730 Torr, such as less than 700 Torr. In some embodiments, which can be combined with other embodiments, the processing operation is a cleaning operation to remove a native oxide from the substrate. In some embodiments, which can be combined with other embodiments, the processing operation is a first epitaxial deposition operation.

Operation 409 includes maintaining a pressure stabilization chamber at the first pressure.

Operation 411 includes transferring the substrate from the first chamber to the pressure stabilization chamber through a first door of the pressure stabilization chamber. In some embodiments, which can be combined with other embodiments, a second door of the pressure stabilization chamber is maintained in a closed position while the substrate is transferred into the pressure stabilization chamber through the first door. In some embodiments, which can be combined with other embodiments, operation 411 includes transferring the substrate via a first transfer chamber while maintaining a pressure of the first transfer chamber at the first pressure. In some embodiments, which can be combined with other embodiments, the closed second door of the pressure stabilization chamber isolates the pressure stabilization chamber from a second transfer chamber. In some embodiments, which can be combined with other embodiments, operation 411 includes maintaining a pressure of the second transfer chamber at the atmospheric pressure.

Operation 413 includes closing the first door of the pressure stabilization chamber.

Operation 415 includes increasing a pressure of the pressure stabilization chamber from the first pressure to an atmospheric pressure within a range of 700 Torr to 800 Torr, for example 700 Torr to 800 Torr, 720 Torr to 790 Torr, 740 Torr to 780 Torr, or 750 Torr to 770 Torr. In some embodiments, which can be combined with other embodiments, the atmospheric pressure is 760 Torr. In some embodiments, which can be combined with other embodiments, the pressure of the pressure stabilization chamber is increased to a pressure that is substantially equal to the pressure of the second transfer chamber. For example, the pressure of the pressure stabilization chamber is increased to a pressure that is within 20 Torr, within 15 Torr, within 10 Torr, or within 5 Torr of the pressure of the second transfer chamber.

Operation 417 includes opening the second door of the pressure stabilization chamber. In some embodiments, which can be combined with other embodiments, the first door is maintained closed while opening the second door.

Operation 419 includes transferring the substrate from the pressure stabilization chamber through the second door to a second processing volume of an epitaxial deposition chamber. In some embodiments, which can be combined with other embodiments, the first door of the pressure stabilization chamber is maintained in the closed position while the substrate is transferred from the pressure stabilization chamber through the second door. In some embodiments in which the second door of the pressure stabilization chamber links the pressure stabilization chamber to a second transfer chamber, operation 419 includes transferring the substrate via the second transfer chamber. In an embodiment where the first chamber is an epitaxial deposition chamber, the epitaxial deposition chamber of operation 419 is a second epitaxial deposition chamber.

Operation 421 includes conducting an epitaxial deposition operation on the substrate while maintaining the second processing volume at the atmospheric pressure and a temperature that is within a range of 400 degrees Celsius to 1,200 degrees Celsius, such as from 400 degrees Celsius to 800 degrees Celsius. In an embodiment where the first processing operation is an epitaxial deposition operation, the epitaxial deposition operation of operation 421 is a second epitaxial deposition operation.

Benefits of the present disclosure include the performing of epitaxial deposition operations at atmospheric pressure and a temperature within a range of 400 degrees Celsius to 1,200 degrees Celsius with cleaning operations at a first pressure (less than the atmospheric pressure) on the same cluster tool; a single cluster tool with two mainframes operating at different pressures; transferring substrates between processing chambers operating at different pressures; increased epitaxial growth rates compared to conventional processes; reduced substrate contaminants and defects compared to conventional processes; and reduced processing delays, reduced costs, and reduced process drift compared to conventional processes. For example, conducting the epitaxial deposition operation at the atmospheric pressure and the second temperature facilitates efficiently increasing epitaxial growth rate while efficiently reducing substrate defects compared to conventional processes.

Additionally, the efficient increasing of epitaxial growth rates while reducing substrate defects compared to conventional processes are facilitated by performing, within a cluster tool and while isolating the substrate from an ambient environment external to the cluster tool, a sequence including: a cleaning operation on a substrate at a first pressure less than an atmospheric pressure; a transfer operation to move the substrate to an epitaxial deposition chamber; and an epitaxial deposition operation on the substrate at an atmospheric pressure.

Furthermore, the efficient increasing of epitaxial growth rates while reducing substrate defects compared to conventional processes are facilitated by performing, within a cluster tool and while isolating the substrate from an ambient environment external to the cluster tool, a sequence including: a first epitaxial deposition operation on a substrate at a first pressure less than an atmospheric pressure; a transfer operation to move the substrate to an epitaxial deposition chamber; and a second epitaxial deposition operation on the substrate at an atmospheric pressure.

It is contemplated that one or more aspects disclosed herein may be combined. As an example, one or more aspects, features, components, and/or properties of the system 100, the processing chamber 200, the deposition chamber 300, and/or the method 400 may be combined. For example, operation parameters (including but not limited to temperatures and pressures) described in relation to the processing chamber 200 and/or the deposition chamber 300 can be combined with the operations described for the method 400. Moreover, it is contemplated that one or more aspects disclosed herein may include some or all of the aforementioned benefits.

The present disclosure achieves unexpected results over other operations. For example, it was thought that transferring substrates between chambers of different pressures can involve processing delays, increased costs, process drift, and substrate defects. However, cluster tools of the present disclosure facilitate operational flexibility and consistent process results by providing controlled discrete environments interlinked by the pressure stabilization chambers 112, 114.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A cluster tool suitable for processing semiconductor substrates, comprising:
   a first mainframe including a first transfer chamber;
   one or more process chambers mounted to the first mainframe and configured to conduct a process operation at a first pressure that is less than 700 Torr;
   a second mainframe including a second transfer chamber, the second mainframe coupled to the first mainframe;
   a pressure stabilization chamber between the first transfer chamber and the second transfer chamber;
   one or more epitaxial deposition chambers coupled to the second mainframe and configured to conduct an epitaxial deposition operation at an atmospheric pressure within a range of 700 Torr to 800 Torr; and
   a controller comprising instructions that, when executed, cause a plurality of operations to be conducted, the plurality of operations comprising:
      performing the process operation on a substrate at the first pressure in one of the one or more process chambers;
      maintaining a pressure of the pressure stabilization chamber at the first pressure;
      transferring the substrate from the process chamber to the pressure stabilization chamber through a first door of the pressure stabilization chamber;
      closing the first door;
      increasing the pressure of the pressure stabilization chamber to the atmospheric pressure;
      opening a second door of the pressure stabilization chamber;
      transferring the substrate from the pressure stabilization chamber to one of the one or more epitaxial deposition chambers; and
      conducting an epitaxial deposition operation on the substrate while maintaining the epitaxial deposition chamber at the atmospheric pressure.

2. The cluster tool of claim 1, wherein the one or more process chambers comprise one or more cleaning chambers, and the process operation is a cleaning operation.

3. The cluster tool of claim 1, wherein the one or more process chambers comprise one or more reduced pressure epitaxial deposition chambers, and the process operation is a reduced pressure epitaxial deposition operation.

4. The cluster tool of claim 1, wherein the first mainframe operates at the first pressure and the second mainframe operates at the atmospheric pressure.

5. The cluster tool of claim 4, wherein the pressure stabilization chamber comprises:
   an internal volume;
   a substrate support disposed in the internal volume;
   a first gas source fluidly connected to the internal volume to supply a pressure stabilization gas to the internal volume; and
   an exhaust pump fluidly connected to the internal volume to exhaust the pressure stabilization gas from the internal volume.

6. The cluster tool of claim 4, further comprising:
   a factory interface; and
   one or more load lock chambers disposed between the factory interface and the first mainframe.

7. A method of processing a substrate, comprising:
   positioning the substrate in a factory interface of a cluster tool;
   transferring the substrate from the factory interface to a first processing volume of a cleaning chamber;
   conducting a cleaning operation on the substrate in the cleaning chamber while maintaining the first processing volume at a first pressure to remove a native oxide from the substrate, the first pressure less than 700 Torr;
   maintaining a pressure of a pressure stabilization chamber at the first pressure;
   transferring the substrate from the cleaning chamber to the pressure stabilization chamber through a first door of the pressure stabilization chamber;
   closing the first door;
   increasing the pressure of the pressure stabilization chamber to an atmospheric pressure within a range of 700 Torr to 800 Torr;
   opening a second door of the pressure stabilization chamber;
   transferring the substrate from the pressure stabilization chamber to a second processing volume of an epitaxial deposition chamber; and
   conducting an epitaxial deposition operation on the substrate while maintaining the second processing volume at the atmospheric pressure;
   wherein the cluster tool comprises:
      a first mainframe including a first transfer chamber;
      one or more process chambers mounted to the first mainframe, the one or more process chambers including the cleaning chamber;
      a second mainframe including a second transfer chamber and the epitaxial deposition chamber, the second mainframe coupled to the first mainframe;
      the pressure stabilization chamber; and
      a controller.

8. The method of claim 7, wherein the first pressure is within a range of 30 Torr to 80 Torr.

9. The method of claim 8, wherein the epitaxial deposition operation is conducted on the substrate while maintaining the second processing volume at a temperature that is within a range of 400 degrees Celsius to 1,200 degrees Celsius.

10. The method of claim 7, wherein transferring the substrate from the cleaning chamber to the pressure stabilization chamber further comprises:
- transferring the substrate via the first transfer chamber while maintaining a pressure of the first transfer chamber at the first pressure; and
- maintaining the second door of the pressure stabilization chamber closed while moving the substrate into the pressure stabilization chamber.

11. The method of claim 10, wherein:
- the closed second door of the pressure stabilization chamber isolates the pressure stabilization chamber from the second transfer chamber; and
- transferring the substrate from the cleaning chamber to the pressure stabilization chamber further comprises maintaining a pressure of the second transfer chamber at the atmospheric pressure.

12. The method of claim 11, wherein the first door is maintained closed while opening the second door.

13. The method of claim 12, wherein transferring the substrate from the pressure stabilization chamber to the second processing volume of the epitaxial deposition chamber further comprises transferring the substrate via the second transfer chamber.

14. A method of processing a substrate, comprising:
- positioning the substrate in a factory interface of a cluster tool;
- transferring the substrate from the factory interface to a first processing volume of a first epitaxial deposition chamber;
- conducting a first epitaxial deposition operation on the substrate in the first epitaxial deposition chamber while maintaining the first processing volume at a first pressure, the first pressure less than 700 Torr;
- maintaining a pressure of a pressure stabilization chamber at the first pressure;
- transferring the substrate from the first epitaxial deposition chamber to the pressure stabilization chamber through a first door of the pressure stabilization chamber;
- closing the first door;
- increasing the pressure of the pressure stabilization chamber to an atmospheric pressure within a range of 700 Torr to 800 Torr;
- opening a second door of the pressure stabilization chamber;
- transferring the substrate from the pressure stabilization chamber to a second processing volume of a second epitaxial deposition chamber; and
- conducting a second epitaxial deposition operation on the substrate while maintaining the second processing volume at the atmospheric pressure;
- wherein the cluster tool comprises:
  - a first mainframe including a first transfer chamber;
  - one or more process chambers mounted to the first mainframe, the one or more process chambers including the first epitaxial deposition chamber;
  - a second mainframe including a second transfer chamber and the second epitaxial deposition chamber, the second mainframe coupled to the first mainframe;
  - the pressure stabilization chamber; and
  - a controller.

15. The method of claim 14, wherein the second epitaxial deposition operation is conducted on the substrate while maintaining the second processing volume at a temperature that is within a range of 400 degrees Celsius to 1,200 degrees Celsius.

16. The method of claim 14, wherein transferring the substrate from the first epitaxial deposition chamber to the pressure stabilization chamber further comprises:
- transferring the substrate via the first transfer chamber while maintaining a pressure of the first transfer chamber at the first pressure; and
- maintaining the second door of the pressure stabilization chamber closed while moving the substrate into the pressure stabilization chamber.

17. The method of claim 16, wherein:
- the closed second door of the pressure stabilization chamber isolates the pressure stabilization chamber from the second transfer chamber; and
- transferring the substrate from the first epitaxial deposition chamber to the pressure stabilization chamber further comprises maintaining a pressure of the second transfer chamber at the atmospheric pressure.

18. The method of claim 17, wherein the first door is maintained closed while opening the second door.

19. The method of claim 18, wherein transferring the substrate from the pressure stabilization chamber to the second processing volume of the second epitaxial deposition chamber further comprises transferring the substrate via the second transfer chamber.

* * * * *